(12) United States Patent
Liberini et al.

(10) Patent No.: US 10,509,056 B2
(45) Date of Patent: Dec. 17, 2019

(54) PROBE CARD FOR A TESTING APPARATUS OF ELECTRONIC DEVICES, PARTICULARLY FOR EXTREME TEMPERATURE APPLICATIONS

(71) Applicant: Technoprobe S.p.A., Cernusco Lombardone (IT)

(72) Inventors: Riccardo Liberini, Cernusco Lombardone (IT); Raffaele Vallauri, Cernusco Lombardone (IT); Giuseppe Crippa, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 0 days.

(21) Appl. No.: 15/257,443

(22) Filed: Sep. 6, 2016

(65) Prior Publication Data

US 2016/0377656 A1 Dec. 29, 2016

Related U.S. Application Data

(63) Continuation-in-part of application No. PCT/IB2015/051606, filed on Mar. 5, 2015.

(30) Foreign Application Priority Data

Mar. 6, 2014 (IT) .............................. MI2014A0350

(51) Int. Cl.
*G01R 1/073* (2006.01)
(52) U.S. Cl.
CPC ..... *G01R 1/07314* (2013.01); *G01R 1/07378* (2013.01)

(58) Field of Classification Search
CPC ..... G01R 3/00; G01R 1/0416; G01R 1/07314
See application file for complete search history.

(56) References Cited

U.S. PATENT DOCUMENTS

| | | | | |
|---|---|---|---|---|
| 7,285,968 B2* | 10/2007 | Eldridge | ............ | G01R 31/2863 324/750.03 |
| 2002/0109514 A1 | 8/2002 | Brandorff et al. | | |
| 2003/0080764 A1* | 5/2003 | Zhou | .................. | G01R 1/07314 324/750.25 |
| 2005/0223543 A1* | 10/2005 | Cohen | ................ | G01R 1/06716 29/602.1 |
| 2008/0157790 A1 | 7/2008 | Hobbs et al. | | |

(Continued)

*Primary Examiner* — Noam Reisner
(74) *Attorney, Agent, or Firm* — Seed Intellectual Property Law Group LLP

(57) ABSTRACT

A probe card for a testing apparatus of electronic devices comprises at least one testing head which houses a plurality of contact probes, each contact probe having at least one contact tip suitable to abut onto contact pads of a device under test, and a support plate of the testing head associated with a stiffener and an intermediate support, connected to the support plate and suitable to provide a spatial transformation of the distances between contact pads made on opposite sides thereof. Conveniently, the probe card comprises a support which is joined to the intermediate support, which is made of a material compatible with the printed circuit board technologies and has a coefficient of thermal expansion greater than $10 \times 10^{-6}$ °$C.^{-1}$, the support being made of a metal material having a coefficient of thermal expansion lower than $6 \times 10^{-6}$ °$C.^{-1}$.

21 Claims, 4 Drawing Sheets

(56) References Cited

U.S. PATENT DOCUMENTS

| | | | |
|---|---|---|---|
| 2008/0278188 A1* | 11/2008 | Chung | G01R 1/07342 324/756.03 |
| 2010/0001748 A1* | 1/2010 | Sasaki | G01R 31/2889 324/754.07 |
| 2010/0019788 A1 | 1/2010 | Boehm et al. | |
| 2010/0207652 A1* | 8/2010 | Chung | G01R 31/2887 324/756.03 |

* cited by examiner

PROBE CARD FOR A TESTING APPARATUS OF ELECTRONIC DEVICES, PARTICULARLY FOR EXTREME TEMPERATURE APPLICATIONS

BACKGROUND

Technical Field

The present invention relates to a probe card for a testing apparatus of electronic devices.

The invention relates to, particularly, though not exclusively, a probe card for extreme temperature applications and the following description has been made with reference to this field of application with the only purpose of simplifying the disclosure thereof.

Discussion of the Related Art

As it is well known, a probe card is a device suitable for placing a plurality of contact pads of a microstructure, particularly of an electronic device integrated on a wafer, into electrical contact with corresponding channels of a testing apparatus which carries out the functionality test, particularly electrical test.

The test, which is carried out on integrated circuits, is particularly used for detecting and isolating defective devices already in the production step. Generally, probe cards are used for electrically testing integrated circuits on wafers before cutting (singulating) and mounting them inside a chip package.

A probe card comprises a testing head including, in turn, a plurality of movable contact elements or contact probes, which are provided with at least one portion or contact tip for a corresponding plurality of contact pads of a device under test. With the terms end or tip is meant herein and below an end portion, which is not necessarily pointed.

Therefore, the effectiveness and reliability of a measure test, among other factors, is known to also depend on the creation of a good electrical connection between a device and a testing apparatus, and therefore on the establishment of an optimal probe/pad electrical contact.

Among the types of testing heads used in the technical sector considered herein for the integrated circuit test, the so-called testing heads with cantilever probes are widely used, which have probes protruding like a fishing rod over a device under test and are also called cantilever testing heads.

Particularly, a cantilever testing head of a known type usually supports a plurality of flexible, in general threadlike, probes with preset electrical and mechanical properties. The probes, cantilevered from the cantilever testing head, have a substantially hooked shape, for the presence of a terminal substantially elbow-folded segment having a generally obtuse internal angle.

The good connection between the probes of a cantilever testing head and the contact pads of a device under test is ensured by pushing the testing head on the device itself, the probes undergoing a vertical bending (relative to the plane defined by the device under test) thereupon in an opposite direction to the movement of the device towards the testing head.

The hooked shape of the probes is such that, during the contact with the contact pads of the device under test and during the probes excursion upwardly beyond a preset contact point usually called "overtravel", the probe contact tips slide on the contact pads over a length usually called "scrub".

Testing heads with vertical probes, which are designated as "vertical probe heads" are also known in the art. A vertical probe head comprises a plurality of contact probes held by at least one pair of plates or dies, which are substantially plate-shaped and parallel to each other. These dies are provided with suitable holes and are arranged at a certain distance from each other such as to leave a free area or air gap for the movement and possible deformation of the contact probes. The pair of dies particularly comprises an upper die and a lower die, both being provided with guiding holes for the contact probes, generally formed by special alloy wires having good electrical and mechanical properties, to axially slide therein.

Also in this case, the good connection between the testing probes and the contact pads of the device under test is provided by pressing the testing head on the device itself, with the contact probes movable within the guiding holes provided in the upper and lower dies being caused to bend within the air gap between the two dies and to slide within these guiding holes upon this pressing contact.

Moreover, the bending of the contact probes within the air gap can be facilitated by a suitable configuration of the probes themselves or the dies thereof, particularly by either using contact pre-shaped probes or suitably horizontally shifting the plates comprising them.

Testing heads are generally used, which have probes that are not fixedly fastened but hold interfaced to a card, which is, in turn, connected to the testing apparatus: these are called testing heads with unlocked probes.

In this case, the contact probes also have an end or contact head towards a plurality of contact pads of that card. The good electrical contact between the probes and the card is secured similarly to the contact with the device under test by pressing the probes onto the contact pads of the card.

Moreover, the card is generally held in position by means of a stiffener. The assembly of the testing head, the card and the stiffener forms a probe card, which generally and schematically designated with 10 in FIG. 1.

Particularly, the probe card 10 comprises a testing head 1, which in the example of the figure is a vertical probe head. In this case, such a testing head 1 comprises, in turn, at least one upper plate or die 2 and a lower plate or die 3, having respective upper and lower guiding holes inside which a plurality of contact probes 4 slide.

Each contact probe 4 has at least one end or contact tip abutting onto a contact pad of a device under test 5, thereby providing the mechanical and electrical contact between said device and a testing apparatus (not illustrated) of which this testing head 1 forms a terminal element.

Moreover, each contact probe 4 has a further contact tip, which is commonly designated as the contact head, towards a plurality of contact pads of the card 6. The good electrical contact between the probes and the card is ensured similarly to the contact with the device under test by pushing the probes onto the contact pads of the card 6.

As stated above, the card 6 is held in position by means of a stiffener 8.

In the vertical probe technology, it is thus also important to ensure a good connection between the contact probes and the testing apparatus, particularly in correspondence of contact heads thereof, and accordingly at the card.

Several technologies are known to manufacture the probe card 10 of the testing apparatus.

Particularly, a first solution provides using printed circuit boards techniques to make the card 10, which is usually also designated with PCB (acronym for: "Printed Circuit Board"). This technology allows making cards having active areas that may even be large-sized, but have huge limitations relative to a minimum pitch value that can be achieved between the contact pads on the device under test.

The ceramic-based technology or MLC (acronym for "Multi-Layer Ceramic") is also known. Such a technology allows obtaining very fine pitches and higher densities as compared with PCB technology, however it has limitations on the maximum number of signals that can be used for the test and on the maximum dimension of the active area that can be placed on the card.

Using MLC technology, plates can be made of rigid ceramic material with a high planarity grade. These plates are not subjected to deformations or locally applied forces, which would only risk breaking them, but they can be provided with a central screw acting as a pivot and lateral adjustment screws associated with counter springs to allow a tilting of the plane defined by the plate itself.

Finally, a so-called hybrid technology can be used, where the testing head is interfaced to an intermediate plate, usually designated as interposer, which is, in turn, connected to a mechanical support, usually designated as plug and connected to the card through soldered bridges. This technology offers great flexibility in terms of surface, pitch and signal density, but is limited in the maximum number of manageable signals, having worst electromagnetic performances as well. A non-negligible disadvantage of the hybrid technology is that it is difficult to automatize.

It should be underlined that the thickness of the intermediate plate (interposer) is generally very low, ranging between 0.5 and 3 mm and therefore has significant planarity problems. By being associated with the stiffener, it makes the whole assembly more rigid and resistant and allows a partial reduction in the defects of planarity in the intermediate plate, which however often turn out to affect the good operation of the cards made with this technology.

The reciprocal positioning of the elements composing the probe card is also a very important parameter. Particularly, different testing methods benefited from the probe card being able to withstand extreme temperatures. In such case, however, the thermal expansions of the elements composing the probe card can affect the proper behavior thereof. Indeed, the elements composing the probe cards of known type usually are fastened through screws. Therefore, during a temperature testing, due to the different coefficients of thermal expansion of the materials making these elements and due to the constrain provided by the screws, the same elements are going to bend causing malfunctioning of the probe card as a whole or at least its missed contact with the contact pads of the device under test.

US patent application published under No. US 2002/0109514 discloses a probe card assembly, wherein an intermediate plate is disposed between a MLC space transformer and a PCB, the electrical connection between the MLC space transformer and the PCB being realized by fuzz buttons, allowing the PCB to be free to thermally expand at a different rate than the MLC while maintaining the electrical connection.

Moreover, US patent application published under No. US 2008/0157790 discloses a stiffener assembly comprising an inner member and an outer member to be coupled to an intermediate plate, wherein a plurality of alignment mechanisms allows the regulation of the inner member with respect to the outer member and allows the reduction of the heat transfer between the components of that assembly.

BRIEF SUMMARY

An embodiment of the present invention is directed to a probe card, which is suitable to support a testing head provided with a plurality of contact probes for connection with a testing apparatus of electronic devices, particularly integrated on a wafer, having such structural and functional characteristics as to allow overcoming the limitations and drawbacks currently experienced with the probe cards made with known technologies, particularly allowing to ensure the proper execution of the tests also at extreme temperatures.

A metal support is associated with an interposer realized with PCB technology in order to have an overall coefficient of thermal expansion which is able to limit as much as possible the dimensional variations due to the thermal expansion of the elements composing the probe card during the testing, even at extreme temperatures.

According to an embodiment of the invention, a probe card for a testing apparatus of electronic devices is provided, the prove card comprising at least one testing head which houses a plurality of contact probes, each contact probe having at least one contact tip suitable to abut onto contact pads of a device under test, and a support plate of the testing head associated with a stiffener and an intermediate support, connected to the support plate and suitable to provide a spatial transformation of the distances between contact pads made on its opposite sides. The probe card suitably comprises a support being joined with the intermediate support, which is made of a material compatible with the printed circuit board technologies and has a coefficient of thermal expansion greater than $10 \times 10^{-6 \circ}$ C.$^{-1}$, the support being made of a metal material having a coefficient of thermal expansion lower than $6 \times 10^{-6 \circ}$ C.$^{-1}$.

More particularly, some embodiments of the invention comprise the following additional and optional features, taken either individually or in combination.

According to an embodiment of the invention, the probe card may comprise a further intermediate support suitable to provide a further spatial transformation of the distances between the contact pads formed on the opposite sides thereof and which is associated with the intermediate support by means of connecting elements, this support being joined with the intermediate support and the contact probes of the testing head being in contact with this further intermediate support.

Particularly, this intermediate support may be made of a material having a coefficient of thermal expansion ranging between $10 \times 10^{-6 \circ}$ C.$^{-1}$ and $14 \times 10^{-6 \circ}$ C.$^{-1}$ and preferably of approximately $12 \times 10^{-6 \circ}$ C.$^{-1}$.

According to this embodiment of the invention, this intermediate support may be made of organic or ceramic material having a coefficient of thermal expansion greater than $10 \times 10^{-6 \circ}$ C.$^{-1}$.

According to another embodiment of the invention, the further intermediate support may be made of silicon having a coefficient of thermal expansion equal to about $4 \times 10^{-6 \circ}$ C.$^{-1}$.

Furthermore, this support may be made of a Nickel-Iron alloy having a Nickel concentration greater than 30%.

Particularly, this Nickel-Iron alloy is selected between known alloys like alloy 42, Nilo® 42, ivar 42 or NiFe 42, with a Nickel percentage equal to 42%.

According to another embodiment of the invention, this support may be glued to the intermediate support.

Furthermore, according to yet another embodiment of the invention, the probe card may further comprise a regulation system, suitable to associate the stiffener with the support to suitably tilt this support.

Particularly, this regulation system may comprise a plurality of screws distributed on a plane of the support and screwed between this support and the stiffener.

This regulation system may comprise adjustment screws positioned at the corners of the support having a substantially parallelepiped shape and at least one support screw acting as a pivot positioned substantially in the center of the support.

Finally, these adjustment screws may be selected between generic screws, screw studs, bolts or hooking systems.

The characteristics and advantages of the probe card according to the embodiments of the invention will result from the description below of one of the embodiments thereof given as a non-limiting example with reference to the attached drawings.

DETAILED DESCRIPTION

Figure 1:
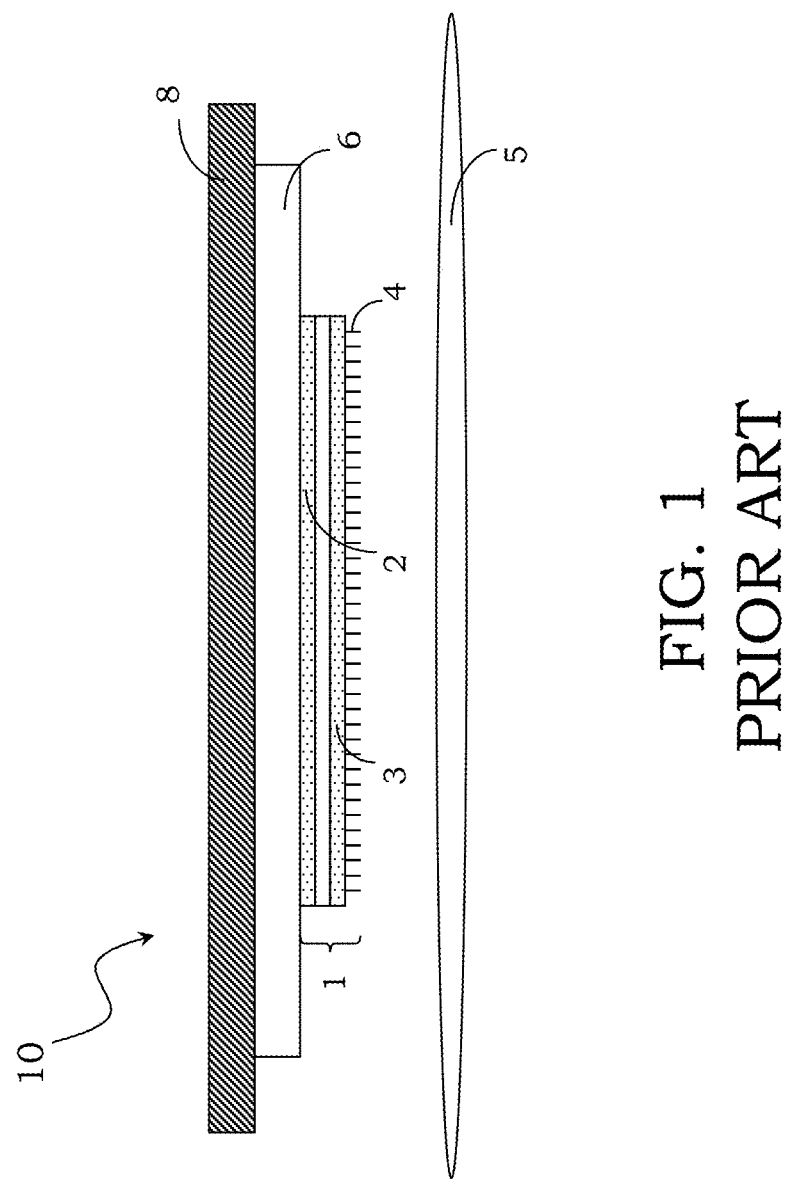
FIG. 1 schematically shows a probe card suitable to support a vertical probe testing head made according to the prior art.
Figure 2:
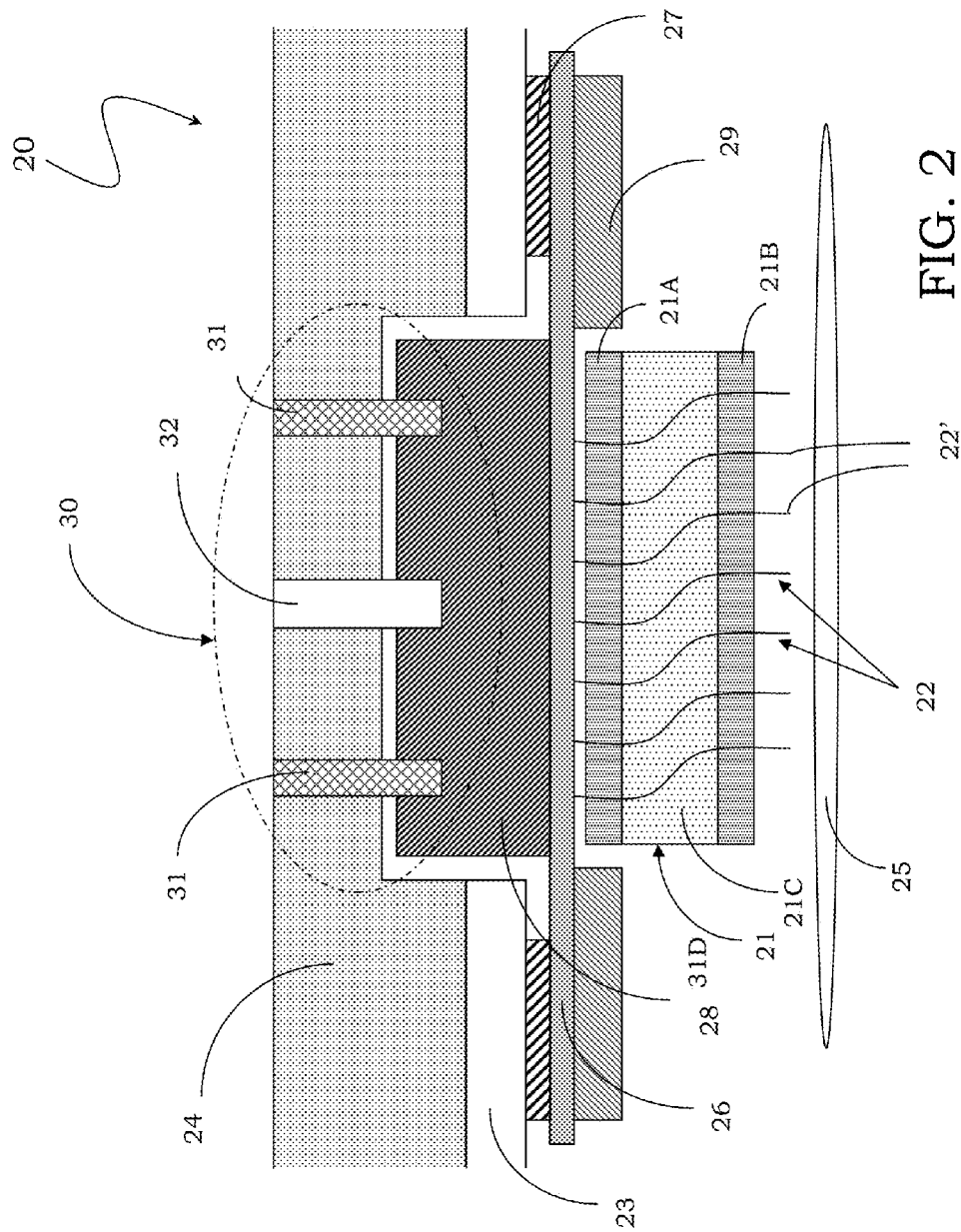
FIG. 2 schematically shows a sectional view of a probe card according to an embodiment of the invention.

With reference to such figures, and particularly to FIG. 2, a probe card comprising at least one testing head provided with a plurality of contact probes for testing electronic devices, particularly integrated on a wafer, is generally designated with 20.

It should be noted that the figures represent schematic views of the card according to embodiments of the invention and are not drawn to scale, on the contrary they are drawn such as to highlight the important characteristics of the invention.

Moreover, the various embodiments of the invention represented by way of example in the figures can be clearly combined with each other and interchangeable between one embodiment and another.

Particularly, as illustrated in FIG. 2, the probe card 20 comprises a testing head 21, which houses a plurality of contact probes 22, and a support plate 23, usually indicated as PCB, and a stiffener 24.

The probe card 20 is suitable to connect with a testing apparatus (not shown). Particularly, in the example illustrated in the figure, the testing head 21 is of a vertical type and comprises at least one upper plate or die 21A and a lower plate or die 21B, having respective holes within which the contact probes 22 slide. By way of example only, the testing head 21 also comprises a containment element 21C of the probes, arranged between the upper 21A and lower 21B dies.

In any case, the contact probes 22 comprise ends or contact tips 22' suitable to abut onto corresponding contact pads of a device under test 25, so to realize the desired, particularly electrical contact between the same and the probe card 20, and then the testing apparatus connected thereto.

The probe card 20 also comprises an intermediate support or interposer 26, associated with the support plate 23 by means of a suitable connector 27.

It should be underlined that the intermediate support or interposer 26 is suitable to provide a spatial transformation of the distances between contact pads made on the opposite sides thereof. Particularly, the interposer 26 can comprise a first plurality of contact pads formed on a first side thereof facing the testing head 21 and having a similar density or pitch, particularly equal to the one of the contact pads of the device under test 25, and a second plurality of contact pads made on a second and opposite side and connected to the support plate 23, which is a printed circuit board or PCB. More particularly, the second plurality of contact pads has a lower density with respect to the first plurality of contact pads, within the interposer 26 being provided suitable electrical connections to realize the addressing between the first plurality and the second plurality of contact pads.

It is also possible use a testing head of a micromechanical type like the so-called micro cantilever, having probes directly soldered to the interposer 26, the disclosure not being limited to one particular type of testing head.

The probe card 20 further comprises a support 28, particularly a metal plug, being solidarized or joined with the interposer 26. More particularly, this support 28 is glued to the interposer 26. Alternatively, it is possible associate the support 28 and the interposer 26 by means of interlocking means, hooking means, or by means of screws.

It is evident that is very important to ensure the planarity of the intermediate support or interposer 26 in order to ensure the proper and simultaneous contact of the contact heads of the contact probes 22 of the testing head 21.

The use of the metal plug to carry out the support 28 joined with the interposer 26 allows reducing the planarity defects thereof, even if it is realized with PCB technology, which is well known to be not very accurate.

Moreover, due to the presence of the support element 28, the interposer 26 is able to support loads of tens of Kg, particularly caused by the contact probes 22 of the testing head 21, without bowing and thus compromising the planarity of the probes themselves during the test.

Substantially, by using this support 28, particularly a metal plug, it is possible to keep rigid and flat the interposer 26, ensuring a proper control on the overtravel of the contact probes 22 of the testing head 21 of the probe card 20.

Moreover, a proper selection of the materials realizing the interposer 26 and the support 28 allows obtaining a contact system with contact probes 22 having a proper coefficient of thermal expansion (CTE, acronym of "Coefficient Of Thermal Expansion"), making the probe card 20 suitable for extreme temperatures applications, too.

It is known indeed to carry out the interposer 26 by means of a micro printed circuit board, namely by means of a material having a high coefficient of thermal expansion CTE, particularly a coefficient of thermal expansion CTE greater than $10 \times 10^{-6\circ}$ C.$^{-1}$, more particularly between $10 \times 10^{-6\circ}$ C.$^{-1}$ and $14 \times 10^{-6\circ}$ C.$^{-1}$ and preferably of approximately $12 \times 10^{-6\circ}$ C.$^{-1}$. As said, on this support 26 the testing head 21 is mounted, which is known to have a low coefficient of thermal expansion CTE, particularly lower than $6 \times 10^{-6\circ}$ C.$^{-1}$, more particularly ranging from $3 \times 10^{-6\circ}$ C.$^{-1}$ to $6 \times 10^{-6\circ}$ C.$^{-1}$, preferably of approximately $5 \times 10^{-6\circ}$ C.$^{-1}$.

Thus it is apparent that, during the probe card 20 operation at extreme temperatures, particularly between −50 and +200° C., there would be a misalignment between the contact heads of the contact probes 22 of the testing head 21 and the pads realized on the interposer 25 exactly due to the different coefficients of thermal expansion CTE.

Conveniently, the interposer 26 is associated with the support 28 made of a material having a coefficient of thermal expansion CTE lower than $6 \times 10^{-6\circ}$ C.$^{-1}$, preferably of approximately $3 \times 10^{-6\circ}$ C.$^{-1}$, in order to lower the coefficient of thermal expansion CTE of the interposer 26-support 28 assembly to a value of approximately $6 \times 10^{-6\circ}$ C.$^{-1}$ in order to reduce or ideally eliminate the mismatch with the testing head 21, which also has a coefficient of thermal expansion CTE lower than $6 \times 10^{-6\circ}$ C.$^{-1}$.

Preferably, the support 28 is realized by means of a metal plug, made of a nickel-iron alloy, with a nickel concentration greater than 30%. It is possible to use known alloys like alloy 42, Nilo® 42, ivar 42 or NiFe 42, to name few, having a nickel percentage equal to 42%. Substantially, they are stainless steels highly charged with nickel.

It is verified that, using this support 28 preferably glued to the interposer 26, a coefficient of thermal expansion CTE of approximately $7 \times 10^{-6\circ}$ C.$^{-1}$ is obtained and therefore the circuits so obtained can be used also at extreme temperatures. Particularly, it should be underlined that the coefficient of thermal expansion CTE of the support 28-interposer 26 assembly is substantially given by the weighted average of the coefficients of thermal expansion CTE of the elements, based on the thickness and number of layers realizing these elements.

Therefore, the whole probe card 20 is a system having a controlled coefficient of thermal expansion CTE.

The probe card 20 also comprises at least one regulation system 30, suitable to associate the stiffener 24 and the support 28 and able to adjust the tilting of the interposer 26 associated with the support 28.

The regulation system 30 comprises a plurality of screws 31, 32 distributed on a plane of this support 28 and screwed between this support 28 and the stiffener 24.

Figure 3:
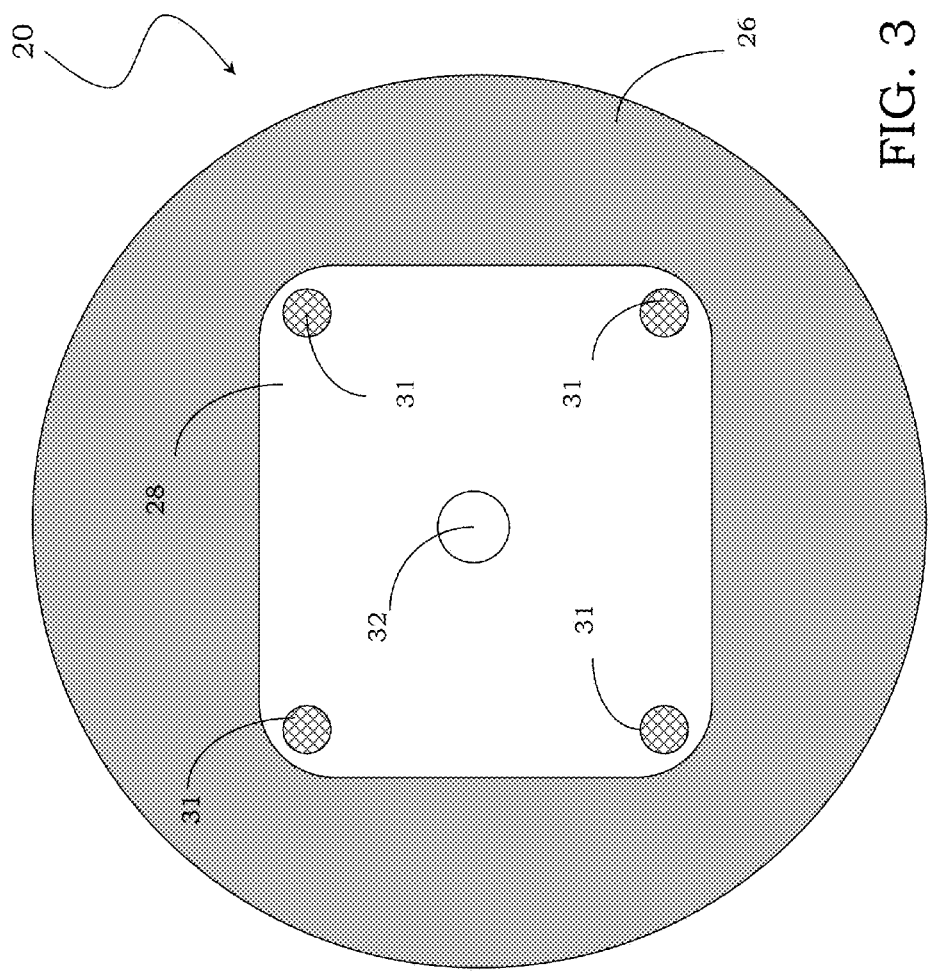
FIG. 3 schematically shows a bottom view of the probe card of FIG. 2.

More particularly, the regulation system 30 comprises adjustment screws 31 positioned at the corners of the support 28 having a substantially parallelepiped shape and at least one support screw 32 positioned substantially in the center of the support 28 acting as a pivot, as depicted in FIG. 3.

Particularly, the adjustment screws 31 are used to conveniently tilt the support 28 by pivoting on the support screw 32.

More particularly, it is possible to use generic screws, screw studs, bolts or hooking systems, to name few.

Each adjustment and support screw can be also provided with a spacer element (not illustrated) such as small squares or washers, conveniently drilled to allow the passage of the screws themselves and suitable to relieve the local load applied by the screws on the support 28 or stiffener 24.

It should be underlined that the probe card 20 can be in contact with pressing elements 29 of the testing apparatus (not illustrated) suitable to push the interposer 26 in the portion not in contact with the support element 28, thus increasing the overall planarity thereof.

Figure 4:
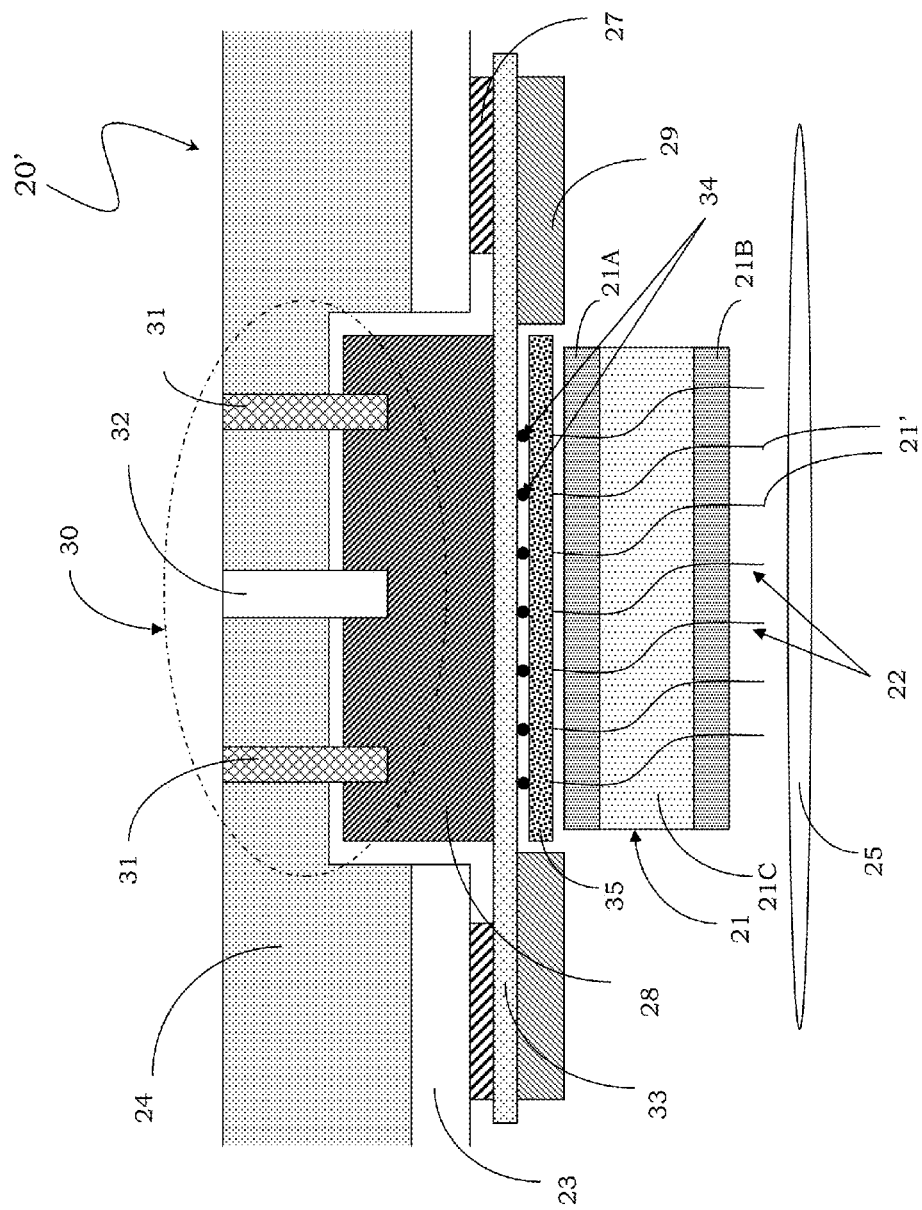
FIG. 4 schematically shows a sectional view of the probe card according to an alternative embodiment of the invention.

In FIG. 4, an alternative embodiment of the probe card according to an embodiment of the invention is depicted, generally designated with 20'. To elements structurally and functionally similar to the ones of the card depicted in FIG. 2 same reference numbers will be given and the detailed description thereof will not be repeated, in order not to unnecessarily burden the current description.

The probe card 20' comprises a first intermediate support or first interposer 33, particularly organic or ceramic, associated with a further or second intermediate support or second interposer 35, particularly made of silicon, by means of connecting elements 34, particularly solder bumps or balls.

The support 28 is connected, particularly glued, with the first interposer 33, and the contact probes 22 of the testing head 21 are in contact with the second interposer 35.

In that case also, a proper selection of the materials realizing the first and second interposer 33 and 35, and the support 28 allows obtaining a contact system with contact probes 22 having a suitable coefficient of thermal expansion CTE, making the probe card 20' also suitable for extreme temperatures applications.

Particularly, the first interposer 33 is made of an organic material, using the multi layer organic technology (MLO, acronym of: "Multi-Layer Organic"), or made of ceramic material, using the multi layer ceramic technology (MLC, acronym of: "Multi-Layer Ceramic") and a high coefficient of thermal expansion CTE, particularly greater than $10 \times 10^{-6\circ}$ C.$^{-1}$. These materials are generally used in the known art.

The second interposer 35, instead, is made of silicon, having a coefficient of thermal expansion CTE of approximately $4 \times 10^{-6\circ}$ C.$^{-1}$.

Similarly to the first embodiment depicted in FIG. 2, the support 28 is made of a metal material, having a coefficient of thermal expansion CTE lower than $6 \times 10^{-6\circ}$ C.$^{-1}$, preferably of approximately $3 \times 10^{-6\circ}$ C.$^{-1}$, in order to lower the coefficient of thermal expansion CTE of the interposer 33-support 28 assembly to a value of approximately $6 \times 10^{-6\circ}$ C.$^{-1}$ in order to reduce or ideally eliminate the mismatch with the second interposer 35, which has, in turn, a coefficient of thermal expansion CTE similar to that of the testing head 21.

Preferably, as previously, the support 28 is realized by means of a metal plug, made of a nickel-iron alloy, having a nickel concentration greater than 30%, for example using known alloys like alloy 42, nilo 42 or ivar 42, having a nickel percentage of 42%.

In this case, it is verified that the probe card 20' also realized according to the modification of the embodiment of FIG. 4 can be effectively used at extreme temperatures too. The probe card 20' is also a system having a controlled coefficient of thermal expansion CTE.

It should be underlined that the presence of the second interposer 35 particularly allows providing a further spatial transformation of the pitches between the contact pads made on the opposite sides thereof. Particularly, the second interposer 35 is made of silicon, in order to be able to make contact pads thereon having similar distances, particularly equal to the ones of the device under test 35. In that way, advantageously according to the embodiments of the invention, it is also possible to perform testing of integrated circuits having distances between the contact pads lower than the distances obtainable with printed circuits board or PCB technology realizing the first interposer 26.

More particularly, the second silicon interposer 35 can comprise a first plurality of contact pads made on a first side facing the testing head 21 and having a density or pitch similar, particularly equal, to the one of the contact pads of the device under test 25, and a second plurality of contact pads made on a second opposite side and connected to the first interposer 33, by means of the connecting elements 34, the second plurality of contact pads having a lower density with respect to the first plurality of contact pads, which allows lowering the needed density for the contact pads of the first interposer 33. The second silicon interposer 35 is also used to perform the addressing between the first plurality and the second plurality of contact pads thereof.

In conclusion, advantageously according to the embodiments of the invention, a probe card is obtained, which is capable to operate properly also in the presence of extreme operative temperatures, particularly temperatures causing thermal expansion of the elements composing it, thus overcoming the drawbacks of the probes currently on the market.

Due to the selected materials and thus to the whole coefficient of thermal expansion obtained for the system formed by the interposer and its support element, the interposer can expand following an increase in the operating temperature of the probe card without transmitting any movement to the testing head, in order to ensure the proper operation of the probe card in operating conditions at extreme temperatures which affect the good operation of the known cards.

Particularly, the probe card configuration prevents a bowing of the support element, due to presence of a thermal gradient therein, related to the different temperatures of the wafer and of the testing apparatus surrounding it, is compensated by selecting the used materials and thus by the whole coefficient of thermal expansion of the system formed by the interposer and its support element, thereby reducing the risks of breaking the interposer itself.

From the foregoing it will be appreciated that, although specific embodiments of the invention have been described herein for purposes of illustration, various modifications may be made without deviating from the spirit and scope of the invention.

We claim:

1. A probe card for a testing apparatus of electronic devices, comprising:
   at least one testing head which houses a plurality of contact probes, each contact probe having at least one contact tip adapted to abut onto a respective contact pad of a plurality of contact pads of a device under test,
   a support plate configured to support the testing head,
   a stiffener associated with the support plate,
   an intermediate support connected to the support plate and adapted to provide a spatial transformation of distances between contact pads on opposite faces of the intermediate support, and
   a support joined with the intermediate support, wherein:
   the intermediate support is made of a material compatible with technologies for printed circuits and having a thermal expansion coefficient greater than $10 \times 10^{-6 \circ}$ $C.^{-1}$ and the support is made of a metallic material having a thermal expansion coefficient smaller than $6 \times 10^{-6 \circ}$ $C.^{-1}$,
   the support plate includes an opening into which at least part of the support is positioned, and
   the support is positioned on a central area of the intermediate support and the support plate is connected to the intermediate support at a peripheral area of the intermediate support that extends outwardly beyond the support.

2. The probe card of claim 1, comprising a further intermediate support adapted to provide a further spatial transformation of distances between contact pads on opposite faces of the further intermediate support,
   the further intermediate support being associated with the intermediate support by connecting elements,
   the support being joined with the intermediate support, and
   the contact probes of the testing head being in contact with the further intermediate support.

3. The probe card of claim 2, wherein the further intermediate support is made of silicon, with a coefficient of thermal expansion of approximately $4 \times 10^{-6 \circ}$ $C.^{-1}$.

4. The probe card of claim 1, wherein the intermediate support is made with a material having a coefficient of thermal expansion between $10 \times 10^{-6 \circ}$ $C.^{-1}$ and $14 \times 10^{-6 \circ}$ $C.^{-1}$.

5. The probe card of claim 4, wherein the intermediate support is made with a ceramic or organic material.

6. The probe card of claim 1, wherein the support is made of an alloy of nickel-iron, having a nickel concentration greater than 30%.

7. The probe card of claim 1, wherein the support is glued to the intermediate support.

8. The probe card of claim 1, further comprising a regulation system configured to associate the stiffener and the support and to suitably tilt the support within the opening of the support plate.

9. The probe card of claim 8, wherein the regulation system comprises a plurality of screws distributed on a plane of the support and screwed between the support and the stiffener.

10. The probe card of claim 9, wherein the regulation system comprises adjusting screws positioned at corners of the support having a substantially parallelepiped shape and a support screw acting as a pin positioned substantially in a center of the support, wherein the adjusting screws are configured to pivot the support on the support screw.

11. The probe card of claim 1, wherein the opening extends in the stiffener and the support extends in the opening in the stiffener and is on an opposite side of the intermediate support with respect to the testing head, the probe card further comprising connectors extending between the support plate the peripheral area of the intermediate support.

12. A probe card for a testing apparatus of electronic devices, comprising:
    at least one testing head which houses a plurality of contact probes, each contact probe having at least one contact tip adapted to abut onto a respective one of a plurality of contact pads of a device under test,
    a support plate configured to support the testing head,
    a stiffener associated with the support plate,
    an intermediate support, connected to the support plate and adapted to provide a spatial transformation of distances between contact pads on opposite faces of the intermediate support, and
    a support glued to the intermediate support, wherein:
    the intermediate support is made of a material compatible with technologies for printed circuits and having a thermal expansion coefficient greater than $10 \times 10^{-6 \circ}$ $C.^{-1}$ and lower than $14 \times 10^{-6 \circ}$ $C.^{-1}$, and
    the support is made of a metallic material having a thermal expansion coefficient greater than $0^\circ$ $C.^{-1}$ and smaller than $6 \times 10^{-6 \circ}$ $C.^{-1}$, and
    the support is positioned at least partially in an opening formed in the stiffener and the support plate, between the stiffener and the intermediate support, and on an opposite side of the intermediate support with respect to the testing head.

13. The probe card of claim 12, comprising a further intermediate support adapted to provide a further spatial transformation of distances between contact pads on opposite faces of the further intermediate support,
    the further intermediate support being associated with the intermediate support by connecting elements,
    the support being glued to the intermediate support, and the contact probes of the testing head being in contact with the further intermediate support.

14. The probe card of claim 12, wherein the intermediate support is made with a material having a coefficient of thermal expansion of approximately $12\times10^{-6}$ $C.^{-1}$.

15. The probe card of claim 14, wherein the intermediate support is made with a ceramic or organic material having a coefficient of thermal expansion greater than $10\times10^{-6}$ $C.^{-1}$.

16. The probe card of claim 13, wherein the further intermediate support is made of silicon, with a coefficient of thermal expansion of approximately $4\times10^{-6}$ $C.^{-1}$.

17. The probe card of claim 12, wherein the support is made of an alloy of nickel-iron, having a nickel concentration greater than 30%.

18. The probe card of claim 12, further comprising a regulation system configured to associate the stiffener and the support and to suitably tilt the support within the opening.

19. The probe card of claim 18, wherein the regulation system comprises a plurality of screws distributed on a plane of the support and screwed between the support and the stiffener.

20. The probe card of claim 19, wherein the regulation system comprises adjusting screws positioned at corners of the support having a substantially parallelepiped shape and a support screw acting as a pin positioned substantially in a center of the support, wherein the adjusting screws are configured to pivot the support on the support screw.

21. The probe card of claim 12, further comprising a connector extending between the support plate a peripheral area of the intermediate support, wherein the support is positioned on a central area of the intermediate support and the support plate is connected to the intermediate support at a peripheral area of the intermediate support by the connector, the peripheral area extending outwardly beyond the support.

* * * * *